(12) United States Patent
Ezaki et al.

(10) Patent No.: US 7,082,789 B2
(45) Date of Patent: Aug. 1, 2006

(54) SILICA GLASS MEMBER FOR SEMICONDUCTOR AND PRODUCTION METHOD THEREOF

(75) Inventors: Masanobu Ezaki, Hadano (JP); Lian-Sheng Pan, Machida (JP); Seiji Taniike, Sagamihara (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 190 days.

(21) Appl. No.: 10/300,739

(22) Filed: Nov. 21, 2002

(65) Prior Publication Data

US 2003/0101748 A1 Jun. 5, 2003

(30) Foreign Application Priority Data

Dec. 5, 2001 (JP) .............................. 2001-371490

(51) Int. Cl.
   *C03B 20/00* (2006.01)
(52) U.S. Cl. ............................ 65/17.4; 65/31; 65/32.1; 65/33.1
(58) Field of Classification Search .................. 65/17.4, 65/31, 32.1, 33.1
   See application file for complete search history.

(56) References Cited

FOREIGN PATENT DOCUMENTS

| JP | 4-046020 A | 2/1992 |
|---|---|---|
| JP | 8-081226 A | 3/1996 |
| JP | 8-165131 A | 6/1996 |
| JP | 8-183621 A | 7/1996 |
| JP | 10-114532 A | 5/1998 |
| JP | 2001-089161 A | 4/2001 |
| JP | 2001-151531 A | 6/2001 |

*Primary Examiner*—Sean Vincent
(74) *Attorney, Agent, or Firm*—Foley & Lardner LLP

(57) ABSTRACT

A silica glass member for semiconductor in which each concentration of Fe, Cu, Cr and Ni is 5 ppb or less and the concentration of an OH group is 30 ppm or less and which has a viscosity of $10^{13.0}$ poise or more at 1200° C. is provided as a silica glass member for semiconductor having high heat-resistance and higher purity.

12 Claims, 1 Drawing Sheet

SILICA GLASS MEMBER FOR SEMICONDUCTOR AND PRODUCTION METHOD THEREOF

BACKGROUND OF THE INVENTION

1. Field of the Invention

The invention relates to a silica glass member for semiconductor such as a furnace core tube, a wafer boat and a heat insulating mould used for the production of a semiconductor and a production method thereof.

2. Description of the Related Art

Conventionally, as silica glass members for semiconductor of this kind, those comprising electrically melted quartz glass which is produced by melting a natural crystal in an electric furnace and then solidifying, those comprising an OH group (hydroxyl group)-containing soot remelted synthetic silica glass produced by hydrolyzing a silicon compound such as silicon tetrachloride in an oxyhydrogen flame and then melting or those comprising highly heat-resistant soot remelted synthetic silica produced by processing a porous body of a synthetic silica powder obtained by hydrolyzing a silicon compound such as silicon tetrachloride in an oxyhydrogen flame and deposited on a synthetic silica powder on a target, in reducing gas having a temperature as high as 1200° C. or more into a transparent glass, are known.

However, those comprising electrically melted quartz glass has a viscosity of $10^{13.2}$ poise at 1200° C. and exhibits high heat resistance. However, these materials have the drawback that the concentration of metal impurities in these materials is high, so that a lot of impurities is discharged and there is therefore a lot of contamination to a semiconductor wafer during the course of the process.

On the other hand, with regard to those comprising an OH group-containing soot remelted synthetic silica glass, high purity materials can be obtained in which each concentration of metal impurities, such as Fe (iron), Cu (copper), Cr (chromium) and Ni (nickel), which are harmful to a semiconductor is 10 ppb or less. However, because no treatment for dehydration of an OH group produced during the production of a porous silica body is carried out, an OH group is contained in the glass in an amount of 100 to 1000 ppm and the viscosity at a temperature of 1200° C. is $10^{12.7}$ poise. Therefore, at a temperature above 1100° C., a deformation due to viscosity is caused, giving rise to unacceptable phenomena such as an expansion of a furnace core tube and a distortion of a wafer boat, leading to a shortage of the life of a silica glass member for semiconductors resultantly.

Meanwhile, those comprising highly heat-resistant soot remelted synthetic silica glass have high purity with each concentration of Fe, Cu, Cr and Ni being 10 ppm or less like the base materials comprising an OH group-containing soot remelted synthetic silica glass, and contain 50 ppm or less of an OH group and a viscosity of $10^{13.1}$ poise at 1200° C. which are the same levels as those of the glass comprising electrically melted quartz glass. However, the development of higher quality glass materials is needed along with the development of more miniaturized and highly integrated semiconductor devices.

SUMMARY OF THE INVENTION

In view of this situation, it is an object of the invention to provide a silica glass member for semiconductor having high heat resistance and higher purity and also to provide a production method thereof.

The above object can be attained by the provision of a silica glass member for semiconductor in which each concentration of Fe, Cu, Cr and Ni is 5 ppb or less and the concentration of an OH group is 30 ppm or less and which has a viscosity of $10^{13.0}$ poise or more at 1200° C.

The silica glass member is preferably a furnace core tube. Also, the silica glass member may be a wafer boat.

A first method of producing a silica glass member for semiconductor comprises heat-treating a silica glass base material in which each concentration of Fe, Cu, Cr and Ni is 100 ppb or less and the concentration of an OH group is 50 ppm or less and which has a viscosity of $10^{13.0}$ poise or more at 1200° C., at a temperature of 1100° C. or more in a non-acidic atmosphere and then etching the entire surface by using hydrofluoric acid.

A second method of producing a silica glass member for semiconductor comprises etching the entire surface of a silica glass base material in which each concentration of Fe, Cu, Cr and Ni is 100 ppb or less and the concentration of an OH group is 50 ppm or less and which has a viscosity of $10^{13.0}$ poise or more at 1200° C., by using hydrofluoric acid and then heat-treating the silica glass material at a temperature of 1100° C. or more in a non-acidic atmosphere.

The silica glass base material is preferably prepared by processing a porous body of a synthetic silica powder obtained by hydrolyzing a silicon compound in an oxyhydrogen flame and deposited on a target, in reducing gas having a temperature as high as 1100° C. or more.

Also, the silica glass base material may be prepared by subjecting a crystal powder to purifying treatment and then melting and solidifying the purified powder.

According to the above silica glass member for semiconductor and the production method thereof, each concentration of Fe, Cu, Cr and Ni which are metal impurities harmful to semiconductors is one-half or less of that of a base material comprising highly heat-resistant soot remelted synthetic silica glass and the heat resistance is equal to that of a base material comprising highly heat-resistant soot remelted synthetic silica glass.

When each concentration of Fe, Cu, Cr and Ni exceeds 5 ppb, a contamination to a semiconductor wafer which is in the midst of processing is not negligible caused by the release of metal impurities from the silica glass.

Each concentration of Fe, Cu, Cr and Ni is more preferably 3 ppb or less.

When the concentration of an OH group exceeds 30 ppm, the viscosity at a temperature of 1100° C. or more is dropped.

The concentration of an OH group is preferably 20 ppm or less.

Also, when the viscosity at a temperature of 1200° C. is less than $10^{13.0}$ poise, viscous deformation is caused at a temperature as high as 1100° C. or more.

The viscosity at 1200° C. is more preferably $10^{13.1}$ poise or more.

If each concentration of Fe, Cu, Cr and Ni of the silica glass base material before the heat treatment performed in an non-acidic atmosphere exceeds 100 ppb, no purifying effect is produced and it is therefore difficult to attain purification to a concentration of 5 ppb or less.

Each concentration of Fe, Cu, Cr and Ni in the silica glass base material is more preferably 40 ppb or less.

When the concentration of an OH group in the silica glass base material exceeds 50 ppm, a purifying effect produced by heat treatment is decreased.

The concentration of an OH group in the silica glass base material is more preferably 20 ppm or less.

If the viscosity of the silica glass base material is less than $10^{13.0}$ poise at 1200° C., viscous deformation is caused at a temperature of 1100° C. or more.

The viscosity of the silica glass base material at 1200° C. is more preferably $10^{13.1}$ poise or more.

The whole surface of the silica glass base material is etched using hydrofluoric acid, whereby a metal impurity layer in which the concentration is more increased at a position closer to the surface is removed.

The thickness of the surface layer portion removed by etching treatment is 0.1 to 40 μm.

When the silica glass base material is heat-treated at 1100° C. or more in a non-acidic atmosphere, metal impurities contained in the silica glass base material are moved to the surface and then emitted into the atmosphere.

As the non-acidic atmosphere, $H_2$ (hydrogen) gas, mixed gas of $H_2$ gas and inert gas such as He (helium) gas, $N_2$ (nitrogen) gas or Ar (argon) gas, CO (carbon monoxide) gas or mixed gas of CO gas and inert gas is used.

When the heat-treating temperature is less than 1100° C., a purifying effect is decreased.

The heat-treating temperature is more preferably 1200° C. or more.

DESCRIPTION OF THE PREFERRED EMBODIMENTS

Figure 1:
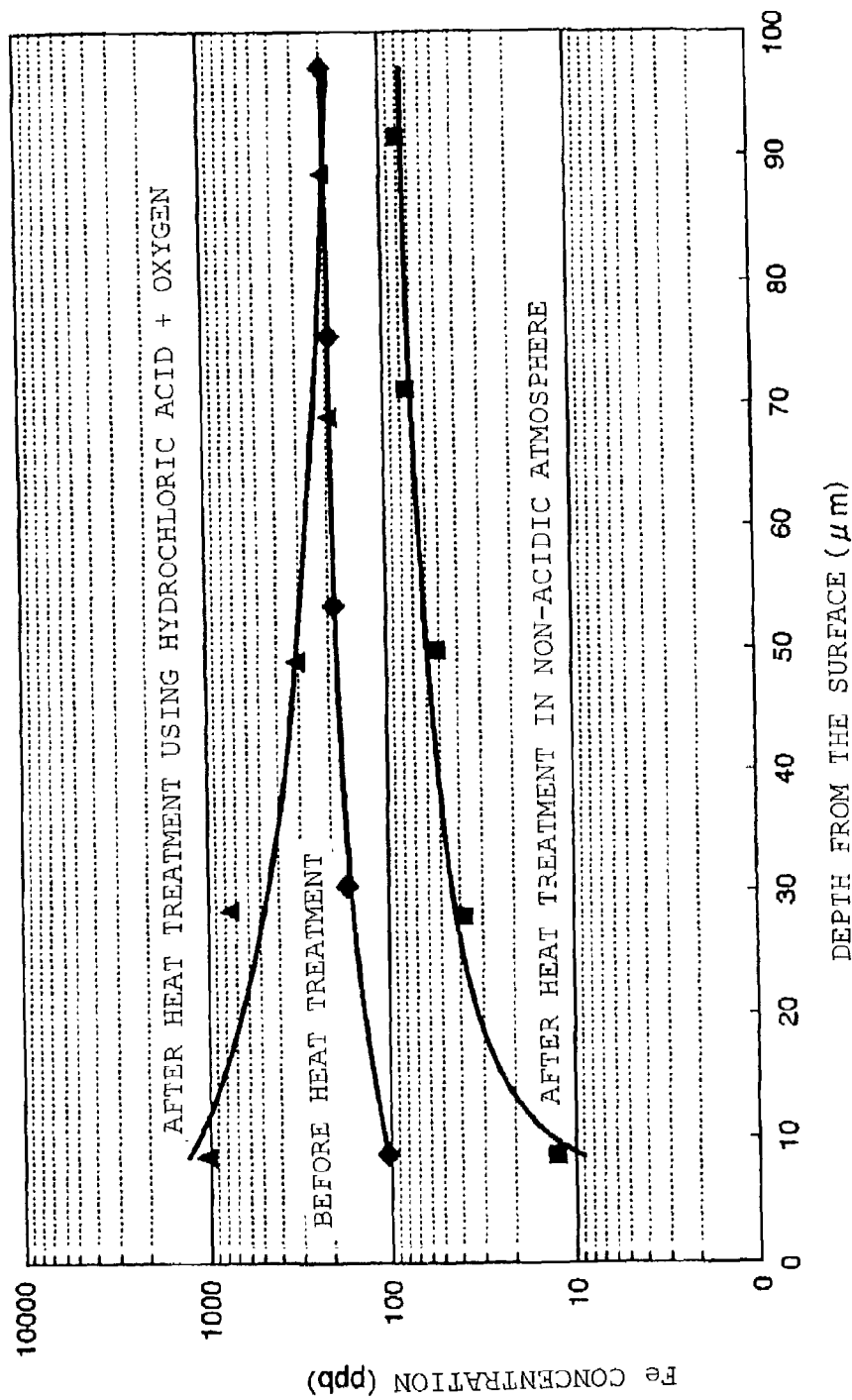
FIG. 1 is an explanatory view showing a difference between the concentrations of Fe in highly heat-resistant soot remelted synthetic silica glass before and after heat treatment under different atmospheres.

Embodiments of the invention will be hereinafter explained by way of examples and comparative examples.

EXAMPLE

First, silicon tetrachloride refined by distillation was vaporized and $O_2$ (oxygen) gas was fed as a carrier gas to a flame of an oxyhydrogen burner to hydrolyze the silicon tetrachloride thereby depositing the synthetic silica powder on a target to make a porous body (soot). This porous body was heat-treated at 1300° C. in a reducing gas atmosphere ($H_2$ gas: 25 vol % and $N_2$ gas: 75 vol %) to obtain highly heat-resistant soot remelted synthetic silica glass.

A sample (20 mm×20 mm×2 mm) was cut out of the resulting highly heat-resistant remelted synthetic silica glass to measure the concentration of an OH group by an infrared absorption spectrum, to find that the concentration was 10 ppm.

Also, each concentration of Fe, Cu, Cr and Ni was measured by an ICP mass spectrometer. As a result, the concentrations at each depth from the surface were as shown in Table 1.

Next, the sample of the highly heat-resistant soot remelted synthetic silica glass was heat-treated at 1200° C. over 10 hours in a non-acidic atmosphere (mixture gas of 25 vol % of $H_2$ gas and 75 vol % of $N_2$ gas). As a result, the concentration of an OH group was 10 ppm and was not therefore changed, but each concentration of Fe, Cu, Cr and Ni at each depth from the surface was as shown in Table 1.

TABLE 1

| | Et'g depyth (μm) | Metal impurities (ppb) | | | |
|---|---|---|---|---|---|
| | | Fe | Cu | Cr | Ni |
| Highly heat-resistant soot remelted synthetic silica glass before heat treatment in a non-acidic atmosphere | 0–14 | 26 | 1 | 1 | 3 |
| | 14–30 | 6 | <1 | <1 | <1 |
| | 30–46 | 5 | <1 | <1 | <1 |
| | 46–64 | 1 | <1 | <1 | <1 |
| | 64–75 | <1 | <1 | <1 | <1 |
| Highly heat-resistant soot remelted synthetic silica glass after heat treatment in a non-acidic atmosphere | 0–16 | 4 | <1 | 1 | <1 |
| | 16–34 | <1 | <1 | <1 | <1 |
| | 34–45 | <1 | <1 | <1 | <1 |
| | 45–67 | <1 | <1 | <1 | <1 |
| | 67–86 | <1 | <1 | <1 | <1 |
| OH group-containing soot remelted synthetic silica glass before heat treatment in a non-acidic atmosphere | 0–14 | 18 | 4 | <1 | 18 |
| | 14–28 | 2 | 4 | <1 | 4 |
| | 28–45 | <1 | 4 | <1 | 1 |
| | 45–62 | <1 | 3 | <1 | <1 |
| | 62–70 | <1 | 3 | <1 | <1 |
| OH group-containing soot remelted synthetic silica glass after heat treatment in a non-acidic atmosphere | 0–14 | 12 | <1 | <1 | <1 |
| | 14–33 | 2 | <1 | <1 | <1 |
| | 33–49 | 2 | <1 | <1 | <1 |
| | 49–64 | <1 | <1 | <1 | <1 |
| | 64–86 | <1 | <1 | <1 | <1 |

Next, the heat-treated sample of the highly heat-resistant soot remelted synthetic silica glass was etched to a depth of 16 μm from the surface over the entire surface by using hydrofluoric acid having a concentration of 15%, with the result that each concentration of Fe, Cu, Cr and Ni was less than 1 ppb.

COMPARATIVE EXAMPLE

First, silicon tetrachloride refined by distillation was vaporized and $O_2$ (oxygen) gas was fed as a carrier gas to a flame of an oxyhydrogen burner to hydrolyze the silicon tetrachloride thereby depositing and melting the synthetic silica powder on a target in the same manner as in the Example to obtain an OH group-containing soot remelted synthetic silica glass.

A sample (20 mm×20 mm×2 mm) was cut out of the resulting OH group-containing soot remelted synthetic silica glass to measure the concentration of an OH group in the same manner as in the Example, to find that the concentration was 80 ppm.

Also, each concentration of Fe, Cu, Cr and Ni was measured in the same manner as in the Example. As a result, the concentrations at each depth from the surface were as shown in Table 1.

Next, the sample of the OH group-containing soot remelted synthetic silica glass was heat-treated at 1200° C. over 10 hours in a non-acidic atmosphere in the same manner as in the Example. As a result, the concentration of an OH group was 80 ppm and was therefore not changed, but each concentration of Fe, Cu, Cr and Ni at each depth from the surface was as shown in Table 1.

Next, the heat-treated sample of the OH group-containing soot remelted synthetic silica glass was etched to a depth of 33 μm from the surface over the entire surface by using hydrofluoric acid having a concentration of 15%, with the result that each concentration of Cu, Cr and Ni was less than 1 ppb but the concentration of Fe was 2 ppb.

Here, a sample of a highly heat-resistant soot remelted synthetic silica glass (different from the Example in the distribution of metal impurity concentration) was heat-treated at 1200° C. over 10 hours in the above-mentioned non-acidic atmosphere and an atmosphere of mixture gas of HCl (hydrogen chloride) gas (10 vol %) and $O_2$ gas (90 vol %), to find that the concentration of Fe at each depth from the surface before and after heat treatment was as shown in Table 1.

As is understood from FIG. 1, only treatment carried out in a non-acidic atmosphere has the effect of decreasing Fe for purification.

It is to be noted that although the explanations of the aforementioned embodiment are concerned with the case of using a highly heat-resistant soot melted synthetic silica glass as a silica glass base material, the silica glass base material is not limited to this case. A base material prepared by purifying a crystal powder, followed by melting and solidifying could also be used as the silica glass base material as far as each concentration of Fe, Cu, Cr and Ni was 100 ppb or less, the concentration of an OH group was 50 ppm or less and the viscosity at 1200° C. was $10^{13.0}$ poise or more.

Also, the order of the treatment performed on the silica glass base material is not limited to the order: heat treatment→etching treatment. Even if heat treatment was performed at 1100° C. or more in a non-acidic atmosphere after etching treatment of the entire surface by using hydrofluoric acid, almost the same effect was obtained.

As is explained above, according to the silica glass member for semiconductor and the method of producing the glass material according to the invention, each concentration of Fe, Cu, Cr and Ni which are metal impurities harmful to semiconductors is one-half or less that of a base material comprising a highly heat-resistant soot remelted synthetic silica glass and the heat resistance is equal to that of a base material comprising a highly heat-resistant soot remelted synthetic silica glass. Therefore, the silica glass member of the invention has high heat-resistance and can be made to have higher purity.

Particularly, even if a silica glass base material containing an OH group in a concentration of 100 ppm or more is processed by the same heat treatment as in the method of the production of a silica glass member for semiconductor according to the invention, not so much effect is obtained. For a silica glass base material having an OH group concentration as small as 50 ppm or less like the invention, the method of producing a silica glass member for semiconductor according to the invention is very effective for high purification.

What is claimed is:

1. A method of producing a silica glass member for use in production of a semiconductor comprising heat-treating a silica glass base material in which each concentration of Fe, Cu, Cr and Ni is 100 ppb or less and the concentration of an OH group is 50 ppm or less and which has a viscosity of $10^{13.0}$ poise or more at 1200° C., at a temperature of 1100° C. or more in a non-acidic atmosphere and then etching the entire surface by using hydrofluoric acid.

2. A method of producing a silica glass member for use in production of a semiconductor comprising etching the entire surface of a silica glass base material in which each concentration of Fe, Cu, Cr and Ni is 100 ppb or less and the concentration of an OH group is 50 ppm or less and which has a viscosity of $10^{13.0}$ poise or more at 1200° C., by using hydrofluoric acid and then heat-treating the silica glass material at a temperature of 1100° C. or more in a non-acidic atmosphere.

3. A method of producing a silica glass member for use in production of a semiconductor according to claim 1, wherein said silica glass base material is prepared by processing a porous body of a synthetic silica powder obtained by hydrolyzing a silicon compound in an oxyhydrogen flame and deposited on a target, in reducing gas having a temperature as high as 1100° C. or more.

4. A method of producing a silica glass member for use in production of a semiconductor according to claim 1, wherein said silica glass base material is prepared by subjecting a crystal powder to purifying treatment and then melting and solidifying the purified powder.

5. A method of producing a silica glass member for use in production of a semiconductor according to claim 2, wherein said silica glass base material is prepared by processing a porous body of a synthetic silica powder obtained by hydrolyzing a silicon compound in an oxyhydrogen flame and deposited on a target, in reducing gas having a temperature as high as 1100° C. or more.

6. A method of producing a silica glass member for use in production of a semiconductor according to claim 2, wherein said silica glass base material is prepared by subjecting a crystal powder to purifying treatment and then melting and solidifying the purified powder.

7. A method according to claim 1, wherein the step of etching comprises removing 0.1 to 40 μm of the surface.

8. A method according to claim 1, wherein the OH group concentration is 30 ppm or less.

9. A method according to claim 1, wherein the OH group concentration is 20 ppm or less.

10. A method according to claim 2, wherein the step of etching comprises removing 0.1 to 40 μm of the surface.

11. A method according to claim 2, wherein the OH group concentration is 30 ppm or less.

12. A method according to claim 2, wherein the OH group concentration is 20 ppm or less.

* * * * *